(12) United States Patent
Sakai

(10) Patent No.: US 7,667,378 B2
(45) Date of Patent: Feb. 23, 2010

(54) ILLUMINATING DEVICE, ELECTRO-OPTIC DEVICE, AND ELECTRONIC APPARATUS

(75) Inventor: Toyohiro Sakai, Azumino (JP)

(73) Assignee: Epson Imaging Devices Corporation (JP)

( * ) Notice: Subject to any disclaimer, the term of this patent is extended or adjusted under 35 U.S.C. 154(b) by 219 days.

(21) Appl. No.: 11/856,101

(22) Filed: Sep. 17, 2007

(65) Prior Publication Data

US 2008/0111944 A1 May 15, 2008

(30) Foreign Application Priority Data

Nov. 14, 2006 (JP) ............... 2006-307537
Jun. 1, 2007 (JP) ............... 2007-146545

(51) Int. Cl.
*H01K 1/58* (2006.01)
*H01J 1/62* (2006.01)

(52) U.S. Cl. ............... 313/46; 313/42; 313/498; 257/99

(58) Field of Classification Search ............ 313/42, 313/46, 498; 257/99
See application file for complete search history.

(56) References Cited

U.S. PATENT DOCUMENTS

| | | | |
|---|---|---|---|
| 6,518,502 B2 * | 2/2003 | Hammond et al. | 257/700 |
| 6,670,751 B2 * | 12/2003 | Song et al. | 313/512 |
| 6,998,777 B2 * | 2/2006 | Suehiro et al. | 313/512 |
| 7,176,502 B2 * | 2/2007 | Mazzochette et al. | 257/99 |
| 7,300,182 B2 * | 11/2007 | Mazzochette | 362/294 |
| 7,304,418 B2 * | 12/2007 | Nagata et al. | 313/32 |
| 7,324,174 B2 * | 1/2008 | Hafuka et al. | 349/61 |
| 2007/0001564 A1 * | 1/2007 | Park | 313/46 |
| 2007/0217202 A1 * | 9/2007 | Sato | 362/294 |

FOREIGN PATENT DOCUMENTS

| | | |
|---|---|---|
| JP | 2002-162626 | 6/2002 |
| JP | 3098463 | 10/2003 |
| JP | 2004-186004 | 7/2004 |
| JP | 2005-136224 | 5/2005 |
| JP | 2005-283852 | 10/2005 |
| JP | 2006-308738 | 11/2006 |
| JP | 2006-310123 | 11/2006 |

* cited by examiner

*Primary Examiner*—Peter Macchiarolo
(74) *Attorney, Agent, or Firm*—Harness, Dickey & Pierce, P.L.C.

(57) ABSTRACT

An illuminating device includes a light source including a light-emitting element, an electrode electrically connected to the light-emitting element, and a heat radiation terminal electrically isolated from the light-emitting element; and a multilayer substrate including a plurality of insulating layers, a plurality of metal layers, an electrically conducting interlayer contact portion, and a heat-conducting interlayer contact portion. The insulating layers include all insulating layer having a mount surface on which the light source is mounted with the electrode and the heat radiation terminal therebetween. The metal layers include an electrically conducting metal layer electrically connected to the electrode and disposed so as to be separated from the light source by the insulating layer having the mount surface and an electrically isolated metal layer electrically isolated from the other metal layers and disposed most distant from the mount surface of all the metal layers. The electrically conducting interlayer contact portion electrically connects the electrode to the electrically conducting metal layer. The heat-conducting interlayer contact portion connects the heat radiation terminal to the electrically isolated metal layer.

11 Claims, 7 Drawing Sheets

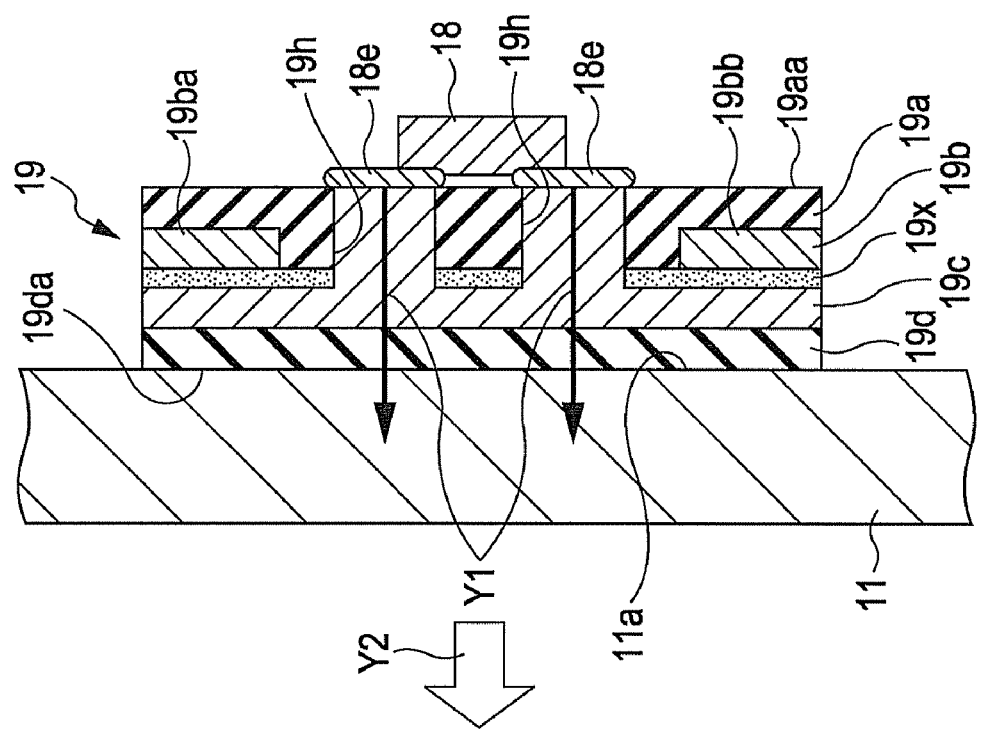
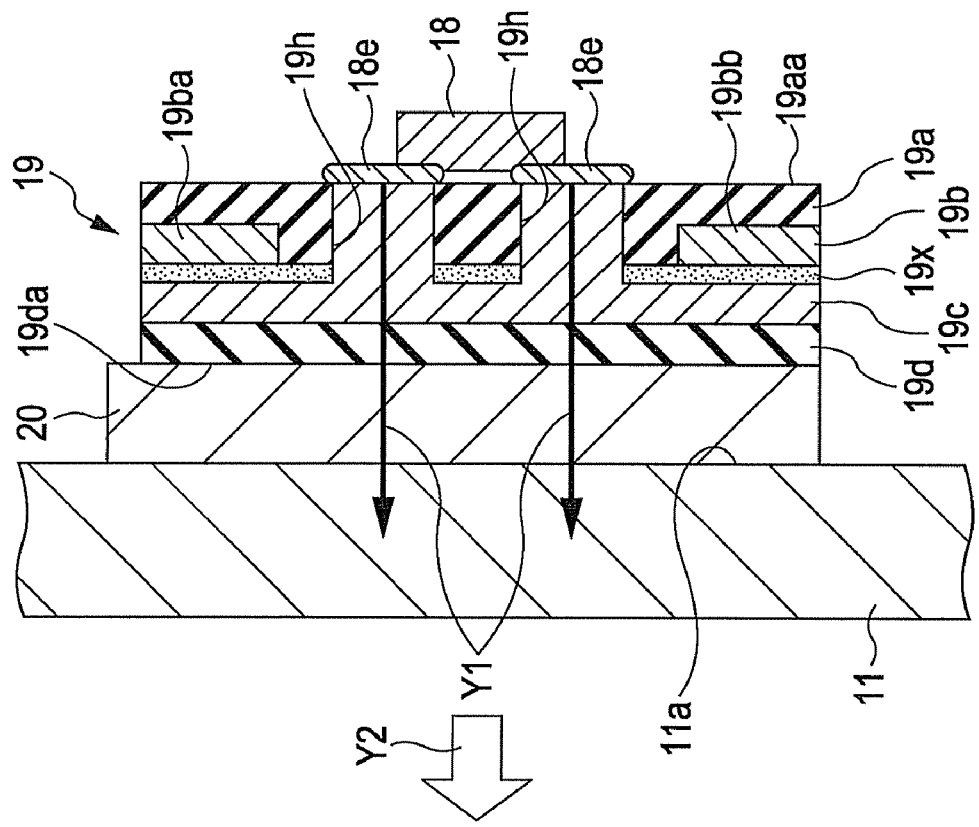

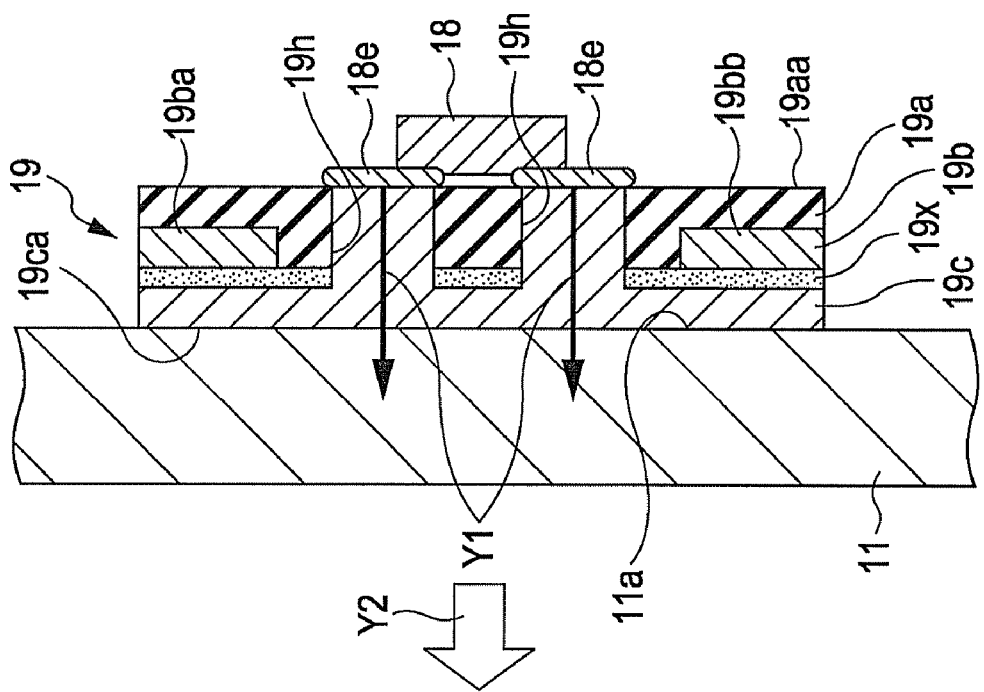
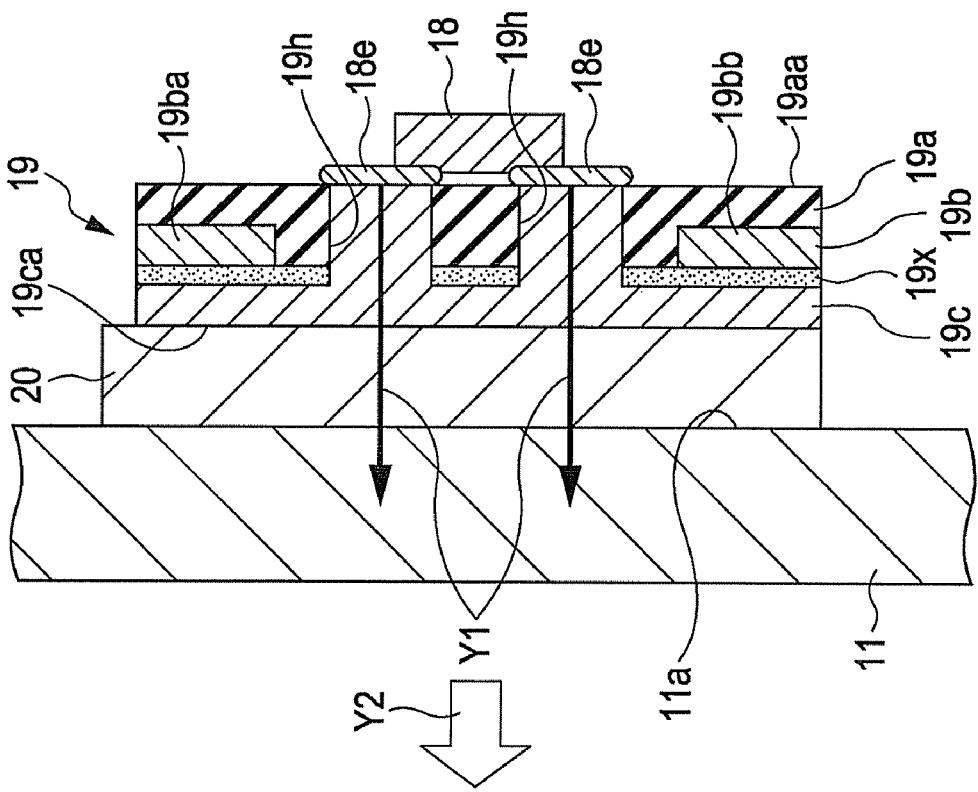

ILLUMINATING DEVICE, ELECTRO-OPTIC DEVICE, AND ELECTRONIC APPARATUS

The entire disclosure of Japanese Patent Application Nos. 2006-307537, filed Nov. 14, 2006 and 2007-146545, filed Jun. 1, 2007 are expressly incorporated by reference herein.

BACKGROUND

1. Technical Field

The present invention relates to an illuminating device suitably used in electro-optic devices.

2. Related Art

Liquid crystal devices, which are a type of electro-optic device, have a backlight at the rear side of the liquid crystal display panel for transmissively displaying images. In general, the backlight is a illuminating device including a light source, such as an LED (light emitting diode), and an optical waveguide allowing the rear surface of the liquid crystal display panel to be irradiated two-dimensionally with light emitted from the light source. A main type of backlight has a light source at an end surface of the optical waveguide and is, thus, called "edge light type".

In particular, vehicle-mounted backlights are larger than portable backlights and require high brightness. However, the LED used as the light source in known portable backlights has low luminous energy and inferior in reliability. Such an LED is not suitable as the light source of the vehicle-mounted backlight. Accordingly, the vehicle-mounted backlight uses as the light source a power LED (hereinafter LED referred to as power LED) that can use a high making current and consequently emit light with high brightness.

Unfortunately, as the making current is increased, the junction temperature of the LED is increased. Consequently the characteristics of the LED are varied and the reliability is degraded. In order to lower the junction temperature, the backlight requires a structure for releasing heat generated from the LED.

Illuminating devices or the like having a structure for releasing heat have been disclosed in, for example, Japanese Unexamined Patent Application Publication Nos. 2004-186004, 2005-283852 and 2002-162626 and Japanese Registered Utility Model No. 3098463. In the illuminating device disclosed in Japanese Unexamined Patent Application Publication No. 2004-186004, the LED light source is provided so that heat is conducted to the metal chassis. Consequently, the heat generated from the LED light source is released by heat conduction to the metal chassis, so that the increase of the LED light source temperature can be prevented. Thus, thermal breakage and breaking of wire can be prevented.

Japanese Registered Utility Model No. 3098463 has disclosed a heat radiator for a backlight-including LCD in winch a metal substrate connected to the LED is bonded to a metal housing case with a heat-conductive adhesive. In this structure, heat generated from the LED is absorbed by the metal substrate and immediately conducted to the metal housing. The metal housing case evenly releases the heat from the surface so that the LCD does not retain the heat.

Japanese Unexamined Patent Application Publication No. 2005-283852 has disclosed a liquid crystal display device. In this device, an LED chip is bonded to a mounting metal film of an LED-mounting substrate with an adhesive, and the mounting metal film and a metal film pattern formed on the chip mount surface are connected to a heat radiation metal film at the rear surface side of the substrate through a metal through hole. Consequently, heat generated at the chip mount surface of the LED-mounting substrate when the LED chip lights up is conducted to the heat radiation metal film from the mounting metal film and the metal film pattern through the metal through hole, and thus the increase of LED chip temperature can be prevented.

Japanese Unexamined Patent Application Publication No. 2002-162626 has disclosed a light source for liquid crystal display. In the heat radiator of this light source, a plurality of LEDs are mounted on a film substrate with a wiring pattern. The rear surface of the film substrate is bonded to a metal support frame with a heat-conductive adhesive. In addition, communicating holes are formed in the film substrate and the support frame corresponding to the LEDs so as to avoid lands, and the holes are filled with a highly heat-conductive adhesive filler. Thus, heat from the light source chip is conducted to the film substrate mainly through the heat-conductive adhesive filler and released. The heat conducted to the film substrate is further conducted to the support frame and released. Thus, the radiator can release the heat from the light source effectively.

However, the above-mentioned Japanese Unexamined Patent Application Publication No. 2004-186004 disclosing an illuminating device and Japanese Registered Utility Model No. 3098463 disclosing a heat radiator for backlight-including LCDs do not describe the heat radiation route from the heat source, or the LED light source, and they do not necessarily provide optimal heat radiation structures.

Although Japanese Unexamined Patent Application Publication No. 2005-283852 disclosing a liquid crystal display device and Japanese Unexamined Patent Application Publication No. 2002-162626 disclosing a heat radiator of a light source for liquid crystal display describe the heat radiation route from the LED light source, the insulation between the mounting substrate and the metal case or between the film substrate and the frame is not taken into account sufficiently and is not ensured accordingly.

In particular, the liquid crystal display device of Japanese Unexamined Patent Application Publication No. 2005-283852 has a complicated heat radiation structure in, for example, the mounting substrate and is accordingly difficult to mass-produce. In this liquid crystal display device, the mounting metal film and metal film pattern for heat radiation and the LED chip-driving metal wire are formed on one surface of the mounting substrate. Therefore, if the areas of the mounting metal film and the metal film pattern are increased from the viewpoint of heat radiation, it becomes difficult to route the driving metal wire and the conductivity is degraded. If the driving metal wire is routed while the areas of the mounting metal film and the metal film pattern are increased, the width of the mounting substrate is disadvantageously increased. In contrast, if the areas of the mounting metal film and the metal film pattern are reduced for ease of wire routing, the heat radiation performance is undesirably degraded.

SUMMARY

An advantage of some aspects of the invention is that it provides an illuminating device and other devices having a light source, which generates heat, mounted on a flexible substrate with a heat radiation route from the light source to a metal frame, optimized to enhance the insulation and the heat radiation and thus enhance the reliability of the light source.

According to an aspect of the invention, an illuminating device is provided which includes a light source and a multilayer substrate. The light source includes a light-emitting element, an electrode electrically connected to the light-emitting element, and a heat radiation terminal electrically isolated from the light-emitting element. The multilayer substrate includes a plurality of insulating layers, a plurality of metal layers, an electrically conducting interlayer contact portion, and a heat-conducting interlayer contact portion. The insulating layers include an insulating layer having a mount surface on which the light source is mounted with the electrode and the heat radiation terminal in between. The metal layers include an electrically conducting metal layer electrically connected to the electrode and disposed so as to be separated from the light source by the insulating layer having the mount surface, and an electrically isolated metal layer electrically isolated from the other metal layers and disposed most distant from the mount surface of all the metal layers. The electrically conducting interlayer contact portion electrically connects the electrode to the electrically conducting metal layer, and the heat-conducting interlayer contact portion connects the heat radiation terminal to the electrically isolated metal layer.

The illuminating device includes the light source and the substrate. The light source includes a light-emitting element represented by a semiconductor light-emitting element, such as LED, and an electrode (for example, a pair of positive and negative electrodes) electrically connected to the light-emitting element, and a heat radiation terminal electrically isolated from the light-emitting element and capable of releasing heat generated from the light-emitting element. The heat radiation terminal is preferably made of a metal having high heat radiation performance. The substrate may be a flexible wiring substrate and has a multilayer structure including a plurality of insulating layers and a plurality of metal layers.

In particular, one of the insulating layers of the substrate has the mount surface on which the light source is mounted with the electrode and the heat radiation terminal. The plurality of metal layers of the substrate include an electrically conducting metal layer electrically connected to the electrode and disposed so as to be separated from the light source by the insulating layer having the mount surface and an electrically isolated metal layer electrically isolated from the other metal layers and disposed most distant from the mount surface of all the metal layers. The electrically conducting interlayer contact portion electrically connects the electrode to the electrically conducting metal layer, and the heat-conducting interlayer contact portion connects the heat radiation terminal to the electrically isolated metal layer.

Thus, the driving current supplied from the power source (not shown) is conducted to the electrode of the light source through an electrically conducting route defined by the electrically conducting metal layer and the electrically conducting interlayer contact portion of the substrate, and the light-emitting element thus emits light. Also, heat generated from the light source in association with light emission can be released through a heat radiation route defined by the heat radiation terminal, the heat-conducting interlayer contact portion and the electrically isolated metal layer. Since the insulating layer has the mount surface on which the light source is mounted, and the heat radiation route is independent of the electrically conducting route and acts as electrically isolated non-conducting portion or layer with no electrical characteristics, the heat radiation efficiency of the illuminating device can be increased with the insulation maintained.

Thus, the increase of junction temperature of the light source can be prevented, and the changes in properties and degradation of reliability of the light source can be prevented.

The illuminating device may further include a first frame having a substrate-supporting surface on which the substrate is supported, and the first frame is made of a material capable of releasing heat. The substrate has a supported surface opposite the mount surface. The supported surface is in close contact with the substrate-supporting surface of the first frame.

Consequently, heat generated from the light source in association with the light emission of the light-emitting element can be released to the outside (the atmosphere) through a heat radiation route defined by the heat radiation terminal, the heat-conducting interlayer contact portion, the electrically isolated metal layer and the substrate-supporting surface of the first frame. Also, since the supported surface of the substrate is in close contact with the substrate-supporting surface of the first frame, heat conducted to the supported surface of the substrate can be further conducted to the frame without reducing the heat radiation efficiency.

In order to efficiently conduct the heat from the light source, the illuminating device may further include a heat-conductive adhesive material, such as a heat-conductive adhesive tape, between the supported surface and the substrate-supporting surface.

In a preferred embodiment, the electrically isolated metal layer extends into the heat-conducting interlayer contact portion, and the electrically conducting interlayer contact portion is connected to the electrically conducting metal layer by, for example, a surface mounting technique (SMT).

Preferably, the heat radiation terminal has a larger surface area than the electrode. Thus, the heat radiation performance can be further increased.

Preferably, the electrically isolated metal layer is formed over the entire surface of at least one insulating layer of the plurality of insulating layers. Thus, the area of the electrically isolated metal layer can be increased to enhance the heat radiation performance.

The illuminating device may further include a second frame made of an insulating material and being engaged with the first frame. The first frame is made of a metal and has a bent portion bent from one end of the substrate-supporting surface. The electrode is disposed at the second frame side, and the heat radiation terminal is disposed at the bent portion of the first frame.

Consequently, even if for surface-mounting the electrode of the light source and the electrically conducting layer of the substrate with a bonding metal, such as solder, the bonding metal runs over the bonding area and spread to a large area, the bonding metal spreads toward the insulating second frame, but not the electroconductive first frame made of a metal and it does not come into contact with the electroconductive first frame. Thus, the light source and the substrate can be prevented from short-circuiting with the electroconductive first frame.

For electrically bonding the heat radiation terminal of the light source or the electrically isolated metal layer of the substrate by a surface mounting technique using a bonding metal, such as solder, the bonding metal may run over the bonding area to spread to the outside. In this instance, the bonding metal runs toward the electroconductive first frame made of a metal, but not toward the second frame. Since the heat radiation terminal of the light source is not electrically connected, but only thermally connected to the electroconductive first frame with the bonding metal, the light source can be prevented from short-circuiting with the electroconductive first frame.

The substrate may be bent so as to oppose the bent portion of the first frame. The supported surface of the bent portion of the substrate is in close contact with the surface of the bent portion of the first frame. Consequently, the direct contact area or an indirect contact area with the heat-conductive adhesive material between the electrically isolated metal layer of the substrate and the first frame can be increased, and thus the heat radiation efficiency can be further increased.

Preferably, the electrically isolated metal layer has the supported surface of the substrate. Thus, the heat radiation efficiency can be further increased while insulation is ensured.

Preferably, the heat radiation terminal, the heat-conducting interlayer contact portion and the electrically isolated metal layer define a heat radiation route of a heat radiation portion. The electrode, the electrically conducting interlayer contact portion and the electrically conducting metal layer define an electrically conducting route of an electrically conducting portion. The heat radiation portion and the electrically conducting portion are electrically insulated from each other by at least one insulating layer of the plurality of insulating layers.

Thus, this structure has the heat radiation portion for releasing the heat generated from the light source in association with light emission, in addition to the electrically conducting portion for emitting light from the light source. Since the heat radiation portion and the electrically conducting portion are insulated from each other by at least one insulating layer of the plurality of insulating layers, the heat radiation efficiency can be increased with insulation maintained.

The substrate of the illuminating device may be flexible.

According to another aspect of the invention, an electro-optic device is provided which includes a display panel that displays images and the illuminating device that illuminates the display panel.

According to still another aspect of the invention, an electronic apparatus including the electro-optic device as a display portion is provided.

BRIEF DESCRIPTION OF THE DRAWINGS

The invention will be described with reference to the accompanying drawings, wherein like numbers reference like elements.

FIGS. 3A and 3B are each a sectional view of a heat radiation structure of an illuminating device according to an embodiment of the invention.

FIGS. 4A and 4B are each a sectional view of a heat radiation structure of all illuminating device according to an embodiment of the invention.

DESCRIPTION OF EXEMPLARY EMBODIMENTS

Preferred embodiments of the invention will now be described with reference to the drawings. In the embodiments disclosed herein, liquid crystal devices will be illustrated as the electro-optic device of the invention.

Structure of Liquid Crystal Device

Figure 1:
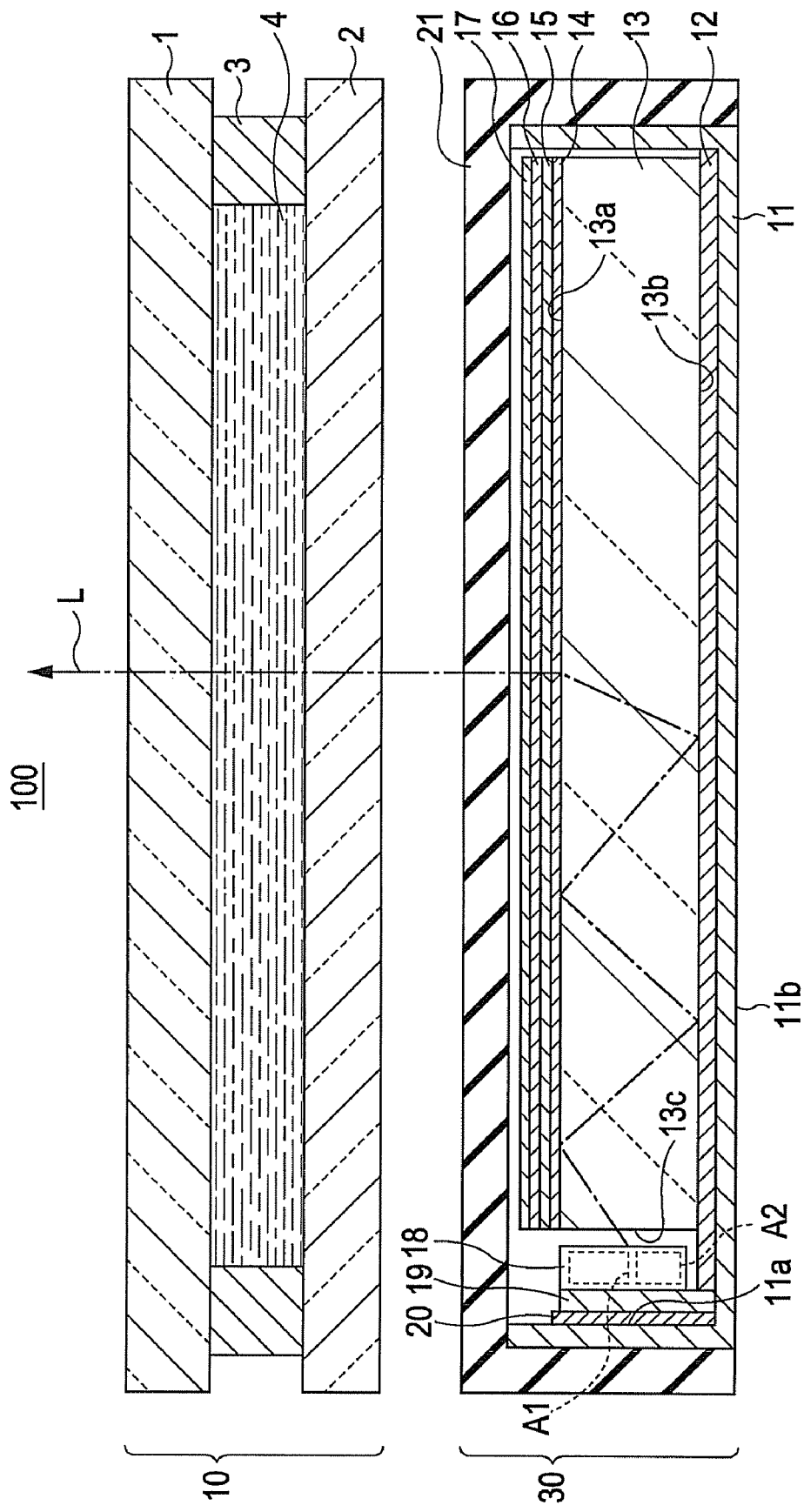
FIG. 1 is a sectional view of a liquid crystal device including an illuminating device according to an embodiment of the invention.

FIG. 1 is a sectional view of a liquid crystal device 100 including an illuminating device according to an embodiment. The liquid crystal device 100 includes a liquid crystal display panel 10 and an illuminating device 30 illuminating the liquid crystal display panel 10.

Structure of Liquid Crystal Display Panel

The liquid crystal display panel 10 has a structure as described below.

The liquid crystal display panel 10 includes a first substrate 1 made of an optically transparent material, such as glass or quartz and a second substrate 2 made of a similar material to the first substrate 1. The first and second substrates are bonded together with a frame-like sealant 3 therebetween, and a liquid crystal layer 4 is disposed between the two substrates. In addition, the liquid crystal display panel 10 has other components (not shown) arranged in a matrix manner (grid manner) or striped manner (linear manner), including a black matrix, color filters, and electrodes. The liquid crystal display panel 10 is not limited to a specific structure and may have a known structure.

Structure of Illuminating Device

The illuminating device 30 has a structure as describe below.

The illuminating device 30 includes mainly a light source 18, a flexible substrate 19 on which the light source 18 is mounted, an optical waveguide 13, a plurality of optical sheets, other components, a first frame 11 supporting those components, and a second frame 21 engaged with the first frame 11.

The optical sheets include a reflection sheet 12, a diffusion sheet 14, a first prism sheet 15, a second prism sheet 16, and a polarizing reflective/transreflective sheet 17. Other components include a heat-conductive adhesive, such a heat-conductive adhesive tape 20.

The first frame 11 is a metal box made of a heat-conductive metal, such as aluminum, having high heat radiation performance, and houses the reflection sheet 12, the optical waveguide 13, the diffusion sheet 14, the first prism sheet 15, the second prism sheet 16 and the polarizing reflective/transreflective sheet 17 stacked in that order. The second frame 21 is a lid made of an insulating material, such as plastic, and is fit to the first frame 11. The flexible substrate (flexible printed circuit, FPC) 19 is flexible and is a wiring substrate for mounting the light source 18. The flexible substrate 19 conducts the driving current supplied from a power source (not shown) to the light source 18 so that the light source 18 emits light, and releases heat generated from the light source 18. The flexible substrate 19 is disposed on an inner wall 11a of the four inner walls (not shown) of the first frame 11, opposing one end surface 13c of the optical waveguide 13 in close contact with each other with the heat-conductive adhesive tape 20. Thus, the inner wall 11a of the first frame 11 supports the flexible substrate 19, and accordingly the inner wall 11a of the first frame 11 is hereinafter referred to as the substrate-supporting surface 11a.

The light source 18 emits light by supplying a driving current through a power source portion (not shown) and the flexible substrate 19. The light L emitted from the light source 18 enters the optical waveguide 13 through an end surface (hereinafter referred to as "light incident end surface") 13c of the optical waveguide 13.

The optical waveguide 13 is made of a transparent resin, such as acrylic resin, and has a rectangular shape in plan view. The optical waveguide 13 uniformly irradiates the surface of the liquid crystal display panel 10 opposing the optical waveguide 13 with light L emitted from the light source 18. The light L coming to the optical waveguide 13 through the light incident end surface 13c repeats reflection between the reflecting surface 13b and the light exit surface 13a of the optical waveguide 13. When the angle formed by the light exit surface 13a and the light L is increased to more than the critical angle, the light L passes through the light exit surface 13a to go out toward the diffusion sheet 14. In this instance, part of the light L is emitted toward the reflection sheet 12 through the reflecting surface 13b and reflected at the reflection sheet 12 disposed at the reflecting surface 13b of the optical waveguide 13, thereby returning to the inside of the optical waveguide 13.

The diffusion sheet 14 diffuses the light L from the optical waveguide 13 to uniformize the brightness of light at the display surface of the liquid crystal display panel 10. The first prism sheet 15 and the second prism sheet 16 are optical members for focusing the light L coming from the diffusion sheet 14 in a specific direction, and, for example, are disposed in such a manner that the shapes of the prisms are arranged perpendicular to each other. Thus, the prism sheets focus the light traveling toward the liquid crystal display panel 10 to increase the intensity. The polarizing reflective/transreflective sheet 17 may be, for example, a DBEF-D (registered trademark of 3M) film, and transmits the P waves of the incident light and reflects the S waves.

The light L emitted from the light source 18 of this structure is transmitted through the optical waveguide 13, the diffusion sheet 14, the first prism sheet 15, the second prism sheet 16, the polarizing reflective/transreflective sheet 17, the liquid crystal display panel 10 in that order. The molecules of the liquid crystal in the liquid crystal layer 4 are aligned at this time and the observer visually recognizes a desired image displayed.

Structure in which Light Source is Mounted on Flexible Substrate

Turning now to FIGS. 2A to 2D, the structure in which the light source 18 is mounted on the flexible substrate 19 will now be described.

Figure 2A:
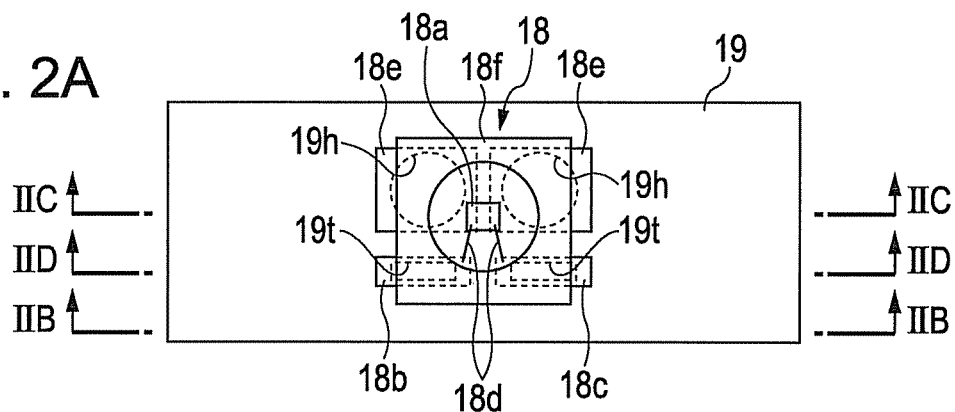
FIGS. 2A to 2D are a plan view and sectional views of a structure of the illuminating device in which a light source is mounted on a flexible substrate.

FIG. 2A shows the structure of the light source 18 in detail. FIG. 2A is a plan view of the structure in which the light source 18 is mounted on the flexible substrate 19 when the light source 18 is viewed from the optical waveguide 13 side in FIG. 1.

The light source 18 includes a semiconductor light-emitting element 18a represented by an LED (light emitting diode), a pair of positive electrode (anode) 18b and negative electrode (cathode) 18c electrically connected to the semiconductor light-emitting element 18a through conductors (wires) 18d, a plurality of heat radiation terminals 18e electrically isolated from the semiconductor light-emitting element 18a, and an enclosure 18f enclosing at least the semiconductor light-emitting element 18a. The heat radiation terminals 18e are used for mounting the semiconductor light-emitting element 18a and releases heat generated from the semiconductor light-emitting element 18a in association with light emission. Preferably, the semiconductor light-emitting element 18a, the conductors 18d, the pair of positive and negative electrodes 18b and 18c, and part of the heat radiation terminals 18e are molded with, for example, a resin in the enclosure 18f.

The semiconductor light-emitting element 18a is preferably a top-view type thin power LED. The heat radiation terminals 18e are preferably made of a highly heat-conductive metal. In addition, the heat radiation terminals 18e desirably have a surface area as large as possible from the viewpoint of enhancing the heat radiation effect. It is desirable that the surface area of the heat radiation terminals 18e be increased as much as possible, and accordingly it is desirable that the heat radiation terminals 18e each have a larger surface area than each of the pair of electrodes 18b and 18c.

Figure 2B:
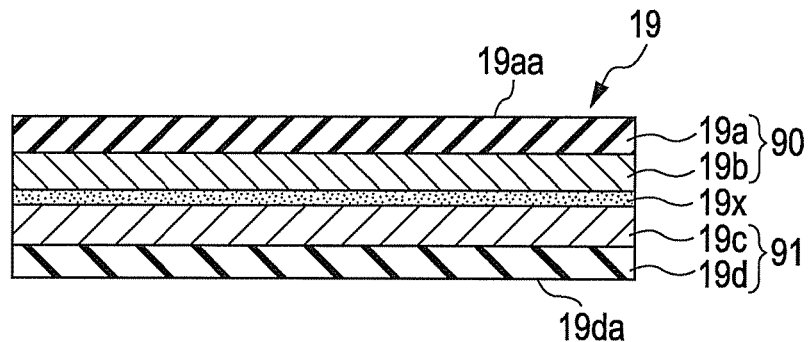

The layered structure of the flexible substrate 19 will now be described with reference to FIG. 2B. FIG. 2B is a sectional view of the fundamental layered structure of the flexible substrate 19 taken along line IIB-IIB of FIG. 2A.

The flexible substrate 19 has a multilayer structure formed by stacking a plurality of multilayer composite including an insulating layer and a metal layer. Specifically, the flexible substrate 19 has a two-layer structure including a first multilayer composite 90 and a second multilayer composite 91. The first multilayer composite 90 and the second multilayer composite 91 are bonded to an insulative adhesive layer 19x acting as an insulating layer.

The first multilayer composite 90 includes a first metal layer 19b and a first insulating layer 19a stacked on one surface of the first metal layer 19b with an adhesive (not shown) in between. The first insulating layer 19a is made of an insulative material, such as polyimide resin. One surface of the first insulating layer 19a serves as the mount surface 19aa on which the light source 18 is mounted with the positive and negative electrodes 18b and 18c and the heat radiation terminals 18e. The first metal layer 19b is made of a highly heat-conductive and electroconductive metal, such as copper. The first metal layer 19b is separated from the light source 18 by the first insulating layer 19a, and electrically connected to the positive and negative electrodes 18b and 18c to act as a conducting layer for conducting a driving current supplied from a power source (not shown) to the light source 18.

The second multilayer composite 91 includes a second insulating layer 19d and a second metal layer 19c stacked on one surface of the second insulating layer 19d with an adhesive (not shown) in between. The second metal layer 19c is made of the same material as the first metal layer 19b. The second metal layer 19c is disposed most distant from the mount surface 19aa in the direction toward the supported surface 19da of the second insulating layer 19d, of the plurality of metal layers. The second metal layer 19c acts as an electrically isolated non-conducting layer that is not electrically connected to the other metal layer and besides acts as a heat radiation layer for conducting heat generated from the light source 18 to the first frame 11. The "non-conducting layer" used herein means that it does not act as a wire through which current is conducted. The second insulating layer 19d is made of the same material as the first insulating layer 19a. The surface of the second insulating layer 19d not having the second metal layer is the supported surface 19da that is brought into contact with the substrate-supporting surface 11a of the first frame 11 with a heat-conductive adhesive tape 20 in between.

The characteristic structures of the flexible substrate 19 and the light source 18 mounted on the flexible substrate 19 will now be described.

Figure 2C:
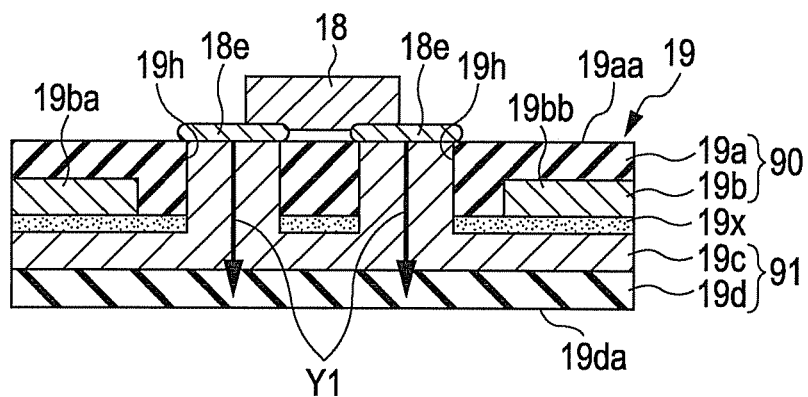

First, the heat radiation route through which heat generated from the light source 18 is conducted to the flexible substrate 19 will be described with reference to FIG. 2C. FIG. 2C is a sectional view taken along line IIC-IIC of FIG. 2A and particularly shows the heat radiation route through which the heat generated from the light source 18 is conducted to the flexible substrate 19.

The flexible substrate 19 has a pair of heat conducting interlayer contact portions (heat-conducting through holes) 19h passing through the first insulating layer 19a, the first metal layer 19b, and the adhesive layer 19x in positions corresponding to the heat radiation terminals 18e of the light source 18.

The second metal layer 19c extends into the heat-conducting interlayer contact portions 19h so that the second metal layer 19c and the heat radiation terminals 18e of the light source 18 are connected through the respective heat-conducting interlayer contact portions 19h. The electrical connections between the second metal layer 19c and the heat radiation terminals 18e of the light source 18 are established with a bonding metal, such as solder, by a surface mount technique (for example, SMT). Also, part of the first insulating layer 19a is disposed between the heat-conducting interlayer contact portions 19h and the first metal layer 19b so that the second metal layer 19c in the heat-conducting interlayer contact portions 19h and the first metal layer 19b are separated and insulated from each other by the first insulating layer 19a. This structure in the present embodiment allows the heat generated from the light source 18 involved in emitting light to be conducted to the first metal layer 19c of the flexible substrate 19 through the heat radiation terminals 18e in the direction indicated by arrows Y1 shown in FIG. 2C. Thus, the second metal layer 19c acts as a heat-conducting layer, and hence the flexible substrate 19 has a heat radiation portion including a heat radiation route defined by the heat radiation terminals 18e of the light source 18, the heat-conducting interlayer contact portions 19h, and the second metal layer 19c.

Figure 2D:
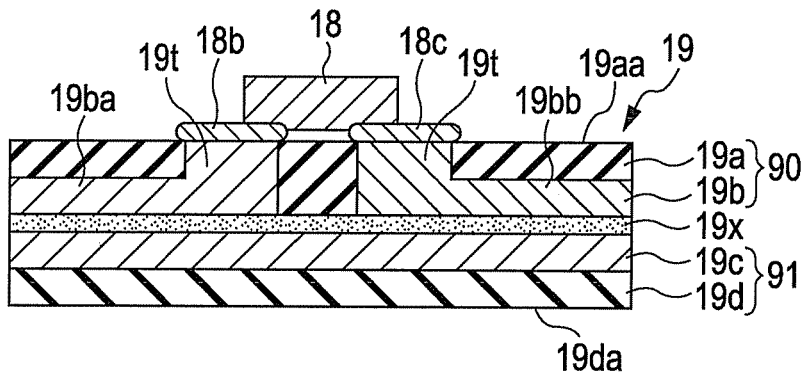

The electrically conducting route through which a driving current supplied from the power source (not shown) is conducted to the light source 18 through the flexible substrate 19 will now be described with reference to FIG. 2D. FIG. 2D is a sectional view taken along line IID-IID of FIG. 2A, and particularly shows the electrically conducting route through which the driving current supplied from the power source is conducted to the light source 18 through the flexible substrate 19.

The flexible substrate 19 has a pair of electrically conducting interlayer contact portions (electrically conducting through holes) 19t passing through the first insulating layer 19a in positions corresponding to the pair of positive and negative electrodes 18b and 18c of the light source 18. The first metal layer 19b includes a first electrically conducting layer 19ba for electrically connecting the positive electrode 18b of the light source 18 and a second electrically conducting layer 19bb for electrically connecting the negative electrode 18c of the light source 18.

Part of the first electrically conducting layer 19ba and part of the second electrically conducting layer 19bb extend into the respective electrically conducting interlayer contact portions 19t, so that the first electrically conducting layer 19ba is electrically connected to the positive electrode 18b through the corresponding electrically conducting interlayer contact portion 19t and the second electrically conducting layer 19bb is electrically connected to the negative electrode 18c through the corresponding electrically conducting interlayer contact portion 19t. For the connections between the first electrically conducting layer 19ba and the positive electrode 18b and between the second electrically conducting layer 19bb and the negative electrode 18c, a surface mount technique is preferably applied. This structure in the present embodiment allows the driving current supplied from the power source (not shown) to be conducted to the pair of positive and negative electrodes 18b and 18c through the pair of first and second electrically conducting layers 19ba and 19bb, thereby allowing the light source 18 to emit light. Thus, the flexible substrate 19 has an electrically conducting portion including an electrically conducting route defined by the pair of first and second electrically conducting layers 19ba and 19bb, the pair of electrically conducting interlayer contact portions 19t, and the pair of positive and negative electrodes 18b and 18c of the light source 18.

Principle of Heat Radiation with Illuminating Device

Turning now to FIG. 3A, the principle of heat radiation with the illuminating device 30 according to the present embodiment will now be described. FIG. 3A is a sectional view of essential portions of the illumination device 30 corresponding to FIG. 2C, including the heat-conductive adhesive tape 20 and the first frame 11.

The illuminating device 30 emits light from the light source 18 by supplying a driving current from the power source (not shown) to the semiconductor light-emitting element 18a of the light source 18 through the electrically conducting portions, and the light source 18 generates heat with the passage of time. The heat generated from the light source 18 is conducted to the second insulating layer 19d of the flexible substrate 19 through the heat radiation portions defined by the heat radiation terminals 18e of the light source 18, the heat-conducting interlayer contact portions 19h, and the second metal layer 19c as indicated by arrows Y1 shown in FIG. 3A and is further released to the outside through the heat-conductive adhesive tape 20 and the first frame 11 as indicated by arrow Y2 shown in FIG. 3A.

The effect and advantage of the illuminating device 30 according to the present embodiment, having a peculiar structure in which the light source 18 is mounted on the flexible substrate 19 will be described with comparison with a known structure.

A comparative illuminating device including a light source mounted on a flexible substrate having a simple multilayer stricture formed by stacking a plurality of multilayer composites including an insulating layer and a metal layer (comparative structure) has the following disadvantages.

In the comparative structure, heat generated from the light source is released to the metal frame through the layers of the flexible substrate. Since the flexible substrate includes some layers blocking heat, that is, insulating layers, the ability of heat radiation can be enhanced by reducing the number of insulating layers as much as possible. In order that the light source emits light, electrically conducting layers are necessary in the flexible substrate and accordingly it is desirable to enhance the insulation. In the comparative structure, however, the heat radiation and the insulation have a trade-off relationship, and it is difficult to satisfy both requirements.

On the other hand, the illuminating device 30 of the present embodiment includes: a light source 18 including the semiconductor light-emitting element 18a, a pair of positive and negative electrodes 18b and 18c electrically connected to a semiconductor light-emitting element 18a, a plurality of heat radiation terminals 18e electrically isolated from the semiconductor light-emitting element 18a; and a flexible substrate 19 having a two-layer stricture formed by stacking the first multilayer composite 90 including the first insulating layer 19a and the first metal layer 19b and the second multilayer composite 91 including the second insulating layer 19d and the second metal layer 19c. The flexible substrate 19 includes a first insulating layer 19a having the mount surface 19aa on which the light source 18 is mounted through the pair of positive and negative electrodes 18b and 18c and the plurality of heat radiation terminals 18e, and an electrically conducting first metal layer 19b separated from the light source 18 by the first insulating layer 19a and connected to the pair of positive and negative electrodes 18b and 18. The first metal layer 19b has a pair of first and second electrically conducting layers 19ba and 19bb electrically connecting to the electrodes. Electrically conducting interlayer contact portions 19t are formed for electrically connecting the pair of first and second electrically conducting layers 19ab and 19bb. The flexible substrate 19 also includes a second metal layer 19c disposed most distant from the mount surface 19aa of all the metal layers and electrically isolated from the other metal layers so as to act as an electrically isolated non-conducting layer, and heat-conducting interlayer contact portions 19h electrically connecting a plurality of heat radiation terminals 18e to the second metal layer 19c.

Thus, a driving current supplied from the power source (not shown) is conducted to the pair of positive and negative electrodes 18b and 18c of the light source 18 through an electrically conducting route defined by the pair of first and second electrically conducting layers 19ba and 19bb and the electrically conducting interlayer contact portions 19t, so that the semiconductor light-emitting element 18a can emit light. In addition, heat generated from the light source 18 in association with light emission of the semiconductor light-emitting element 18a is released through the heat radiation route defined by the heat radiation terminals 18e, the heat-conducting interlayer contact portions 19h, and the electrically isolated second metal layer 19c.

Furthermore, the first insulating layer 19a having the mount surface 19aa on which the light source 18 is mounted is insulative, and the heat radiation route is independent of the electrically conducting route and acts as electrically isolated non-conducting layer or portion with no electrical characteristics. Thus, the heat radiation efficiency of the illuminating device 30 can be increased with the insulation maintained.

Accordingly, the increase of junction temperature of the light source 18 can be prevented, and the changes in properties and degradation of reliability of the light source 18 can be prevented.

In the present embodiment, the illuminating device 30 includes a first frame 11 made of a material capable of releasing heat, having a substrate-supporting surface 11a on which the flexible substrate 19 is mounted, and the supported surface 19da of the second insulating layer 19d opposite the mount surface 19aa of the flexible substrate 19 is in close contact with the substrate-supporting surface 11a of the first frame 11 with the heat-conductive adhesive tape 20 in between.

Consequently, the heat generated from the light source 18 in association with the light emission of the semiconductor light-emitting element 18a is released to the outside (the atmosphere) through the heat radiation route defined by the heat radiation terminals 18e, the heat-conducting interlayer contact portions 19h, the electrically isolated second metal layer 19c, and the substrate-supporting surface 11a of the first frame 11. In addition, since the supported surface 19da of the second insulating layer 19d of the flexible substrate 19 is in close contact with the substrate-supporting surface 11a of the first frame 11 with the heat-conductive adhesive tape 20 in between, the heat conducted to the second insulating layer 19d is further conducted to the first frame 11 through the heat-conductive adhesive tape 20 without reducing the heat radiation efficiency.

The second metal layer 19c acts not only an electrically isolated layer, but also a heat radiation layer. From the viewpoint of enhancing the heat radiation efficiency, it is preferable that the second metal layer 19c has a surface area as large as possible. Accordingly, the second metal layer 19c is preferably formed over the entirety of one surface 19db of the second insulating layer 19d.

The illuminating device 30 has a heat radiation portion including the heat radiation route defined by the heat radiation terminals 18e of the light source 18, the heat-conducting interlayer contact portions 19h and the electrically isolated second metal layer 19c, and a electrically conducting portion including the electrically conducting route defined by the pair of positive and negative electrodes 18b and 18c of the light source 18, the pair of electrically conducting interlayer contact portions 19t and the pair of first and second electrically conducting layers 19ba and 19bb. The heat radiation portion and the electrically conducting portion are insulated from each other by the first insulating layer 19a and the insulative adhesive layer 19x.

More specifically, the above-described structure has the heat radiation portion shown in FIGS. 2C and 3A for releasing the heat generated in association with the light emission of the light source 18, in addition to the electrically conducting portion for emitting light from the light source 18 as shown in FIG. 2D. Since the heat radiation portion and the electrically conducting portion are insulated from each other by the first insulating layer 19a and the insulative adhesive layer 19x, the heat radiation performance can be enhanced with insulation maintained.

The illuminating device 30 further includes a second frame 21 made of an insulative material, engaged with the first frame 11. The first frame 11 has a bent portion (bottom of the first frame 11) 11b bent from one end of the substrate-supporting surface 11a toward the optical waveguide 13. The pair of positive and negative electrodes 18b and 18c of the light source 18 are disposed at the second frame 21 side as indicated by a broken line A1 shown in FIG. 1 and the heat radiation terminals 18e of the light source 18 are disposed at the bent surface 11b side as indicated by a broken line A2 shown in FIG. 1.

Consequently, even if for surface-mounting the pair of positive and negative electrodes 18b and 18c of the light source 18 and the pair of first and second electrically conducting layers 19ba and 19bb of the flexible substrate 19 with a bonding metal, such as solder, the bonding metal runs over the bonding area and spread to a large area, the bonding metal spreads to the second frame 21 side, but not the first frame 21 side and it does not come into contact with the electroconductive first frame 11 made of a metal. Thus, the light source 18 and the flexible substrate 19 can be prevented from short-circuiting with the electroconductive first frame 11.

For electrically bonding the heat radiation terminals 18e of the light source 18 or the second metal layer 19c of the flexible substrate 19 by a surface mounting technique using a bonding metal, such as solder, the bonding metal may run over the bonding area to spread to the outside. In this instance, the bonding metal runs toward the electroconductive first frame 11 made of a metal, but not toward the second frame 21. Since the heat radiation terminals 18e of the light source 18 is not electrically connected, but only thermally connected to the first frame 11 with the bonding metal, the light source 18 can be prevented from short-circuiting with the electroconductive first frame 11.

Modification 1

The flexible substrate 19 in the above-described embodiment has the insulative adhesive layer 19x between the first metal layer 19b and the second metal layer 19c. In addition to the adhesive layer 19x, an insulating layer similar to the first insulating layer 19a or the second insulating layer 19d may be disposed between the first metal layer 19b and the second metal layer 19c.

Modification 2

The illuminating device 30 of the invention does not necessarily require the heat-conductive adhesive tape 20. The supported surface 19da of the second insulating layer 19d may be in direct close contact with the substrate-supporting surface 11a, as shown in FIG. 3B.

Modification 3

The flexible substrate 19 may not have the second insulating layer 19d that is in contact with one surface of the electrically isolated second metal layer 19c. More specifically, this surface 19ca of the second metal layer 19c acts as the supported surface so as to be in contact with the substrate-supporting surface 11a of the first frame 11 with the heat-conductive adhesive tape 20 in between, as shown in FIG. 4A.

Modification 4

The illuminating device 30 of the invention does not necessarily require the heat-conductive adhesive tape 20 or the second insulating layer 19d of the flexible substrate 19. More specifically, the supported surface 19ca of the second metal layer 19c may be in direct close contact with the substrate-supporting surface 11a of the first frame 11, as shown in FIG. 4B. Consequently, the heat radiation efficiency can be further increased as the second insulating layer 19d is removed, with insulation maintained.

In order to prevent the supported surface 19ca of the second metal layer 19c from rusting, the supported surface 19ca may be coated with a protective film (not shown). Since the second metal layer 19c is electrically isolated, the protective film can be formed thin without allowing for insulation.

Modification 5

While the flexible substrate 19 of the above embodiment has a two-layer structure formed by stacking the first multilayer composite 90 and the second multilayer composite 91, the flexible substrate 19 may have a multilayer stricture including more than two multilayer composites without being limited to the two-layer structure.

Figure 5A:
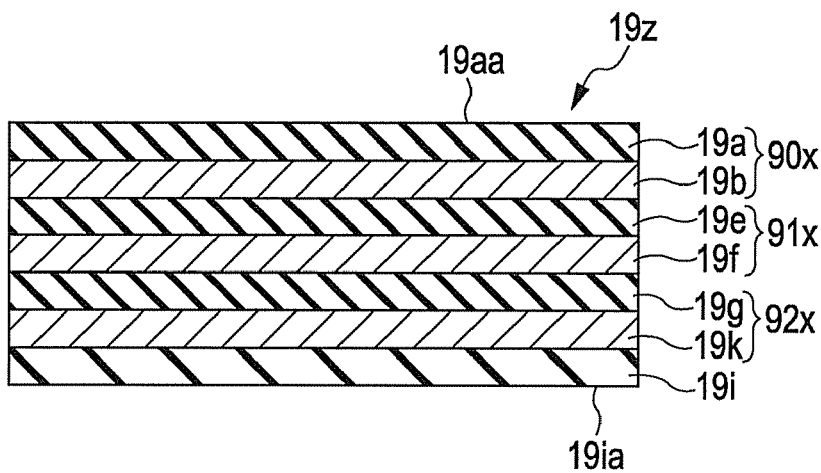
FIGS. 5A to 5C are sectional views of a structure of an illuminating device in which a light source is mounted on a flexible substrate, according to Modification 5.
Figure 5B:
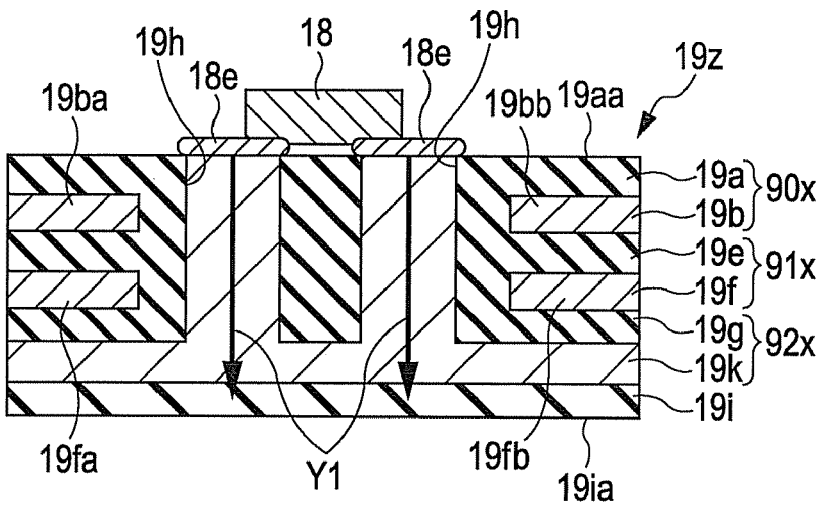
Figure 5C:
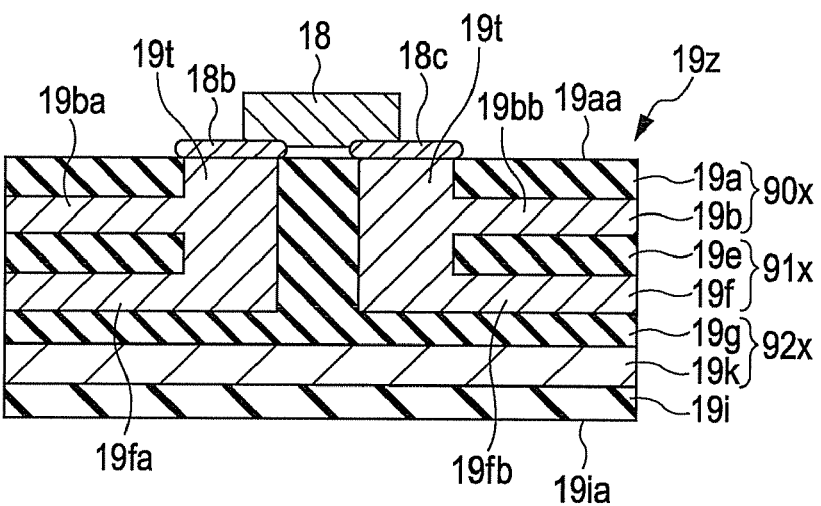
Figure 6A:
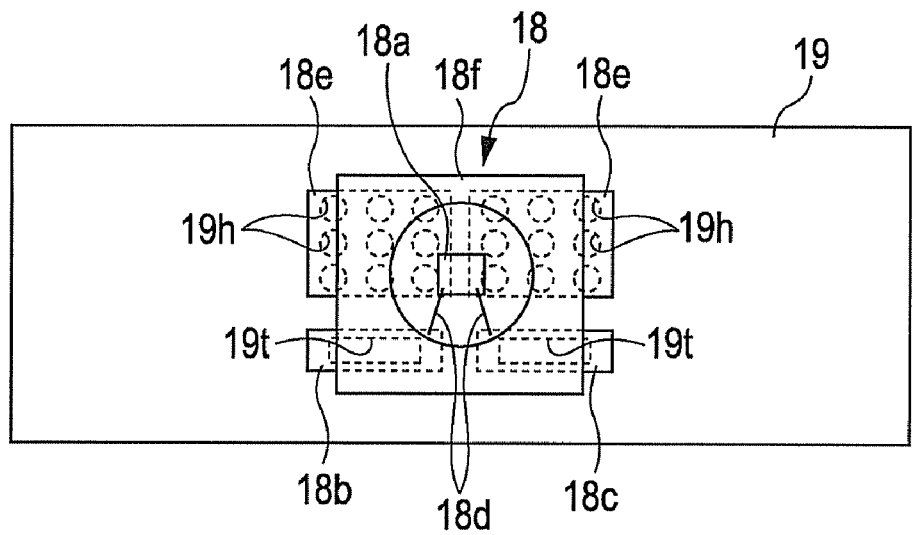
FIGS. 6A and 6B are a plan view and a sectional view of a structure of an illuminating device in which a light source is mounted on a flexible substrate, according to Modifications 6 and 7.
Figure 6B:
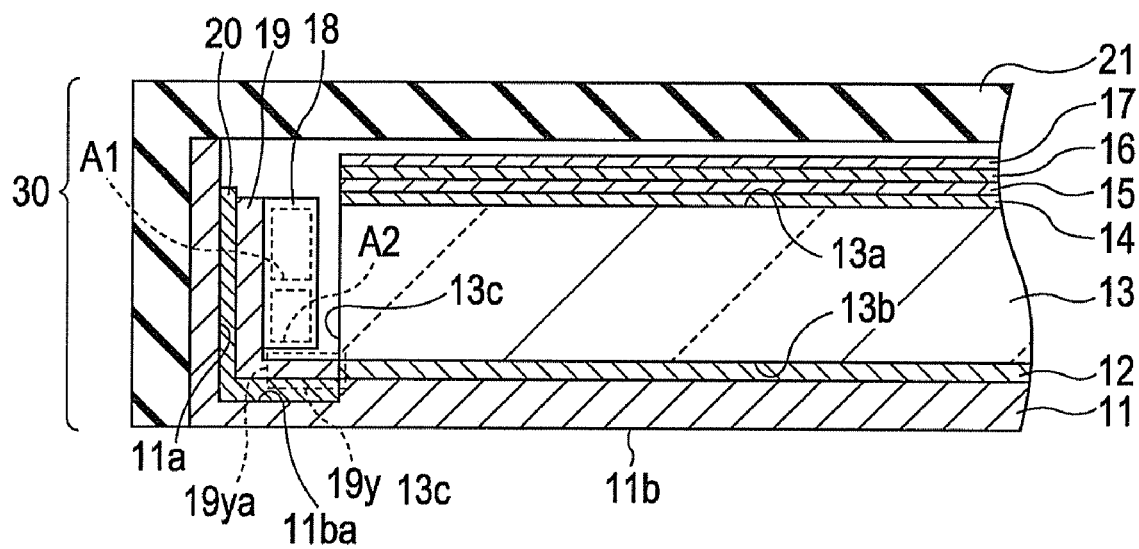

For example, the flexible substrate 19 may have a three-layer structure formed by stacking three multilayer composites as shown in FIGS. 5A to 5C, which are sectional views of a flexible substrate according to Modification 5.

The fundamental layered structure of the flexible substrate 19z according to Modification 5 will now be described with reference to FIG. 5A. The same parts in the drawings are designated by the same numerals and the descriptions of such parts will be omitted. FIG. 5A is a sectional view of the fundamental layered structure of the flexible substrate 19z of Modification 5 and accords to FIG. 2B.

The flexible substrate 19z includes a three-layer structure formed by stacking a first multilayer composite 90x, a second multilayer composite 91x and a third multilayer composite 92x, and an additional insulating layer 19i.

The first multilayer composite 90x includes a first metal layer 19b and a first insulating layer 19a stacked on one surface of the first metal layer 19b with an adhesive (not shown) in between.

The second multilayer composite 91x includes a second metal layer 19f and a second insulating layer 19e stacked on one surface of the second metal layer 19f with an adhesive (not shown) in between. The second metal layer 19f is made of the same material as the first metal layer 19b and the second insulating layer 19e is made of the same material as the first insulating layer 19a.

The third multilayer composite 92x includes a third metal layer 19k and a third insulating layer 19g stacked on one surface of the third metal layer 19k with an adhesive (not shown) in between. The third metal layer 19k is made of the same material as the first metal layer 19b and the third insulating layer 19g is made of the same material as the first insulating layer 19a. The third metal layer 19k acts as a heat radiation portion for conducting heat generated from the light source 18 to the first frame 11 and is electrically isolated from the semiconductor light-emitting element 18a.

The additional insulating layer 19i is disposed on the other surface of the third metal layer 19k. The surface of the additional insulating layer 19i opposing the third metal layer 19k acts as the supported surface 19ia that is brought into contact with the substrate-supporting surface 11a of the first frame 11 with a heat-conductive adhesive tape 20 in between. It is however not necessary to provide the additional insulating layer 19i on the surface of the third metal layer 19k.

The structure of the heat radiation portion of the flexible substrate 19z according to Modification 5 will now be described with reference to FIG. 5B.

In the flexible substrate 19z of Modification 5, the third metal layer 19k, which is most distant of all the metal layers from the mount surface 19aa in the direction toward the supported surface 19ia of the additional insulating layer 19i, is electrically isolated, and is connected to the heat radiation terminals 18e through a plurality of heat-conducting interlayer contact portions 19h formed in the flexible substrate 19. The portions of the third metal layer located inside the heat-conducting interlayer contact portions 19h are insulated from the first metal layer 19b and the second metal layer 19f by the first insulating layer 19a, the second insulating layer 19e and the third insulating layer 19g. The supported surface 19ia of the additional insulating layer 19i opposite the mount surface 19aa is in close contact with the substrate-supporting surface 11a of a first frame 11 (not shown) with a heat-conductive adhesive tape in between.

Consequently, heat generated from the light source 18 in association with light emission is conducted to the heat radiation terminals 18e of the light source 18 and further conducted to the heat-conducting interlayer contact portions 19h, the third metal layer 19h, and thus to the additional insulating layer 19i, and subsequently to the first frame 11 through the heat-conductive adhesive tape 20. Thus, the heat is finally released to the outside through the first frame 11. Since the supported surface 19ia of the additional insulating layer 19i is in close contact with the substrate-supporting surface 11a of the first frame 11 with the heat-conductive adhesive tape 20 in between, the heat conducted to the additional insulating layer 19i is further conducted to the first frame 11 through the heat-conductive adhesive tape 20 without degrading the heat radiation efficiency. Also, since the heat radiation portion defined by the heat radiation terminals 18e, the heat-conducting interlayer contact portions 19h and the third metal layer 19k is electrically isolated and acts as electrically non-conducting portion or layers, the heat radiation efficiency can be increased with insulation maintained.

Thus, the increase of junction temperature of the light source 18 can be prevented, and the changes in properties and degradation of reliability of the light source 18 can be prevented.

Turning now to FIG. 5C, the structure of the electrically conducting portion of the flexible substrate 19z of Modification 5 will be simply described.

The flexible substrate 19z of Modification 5 has a pair of electrically conducting interlayer contact portions 19t passing through the first insulating layer 19a, the first metal layer 19b, the second metal layer 19f and the second insulating layer 19e in positions corresponding to the pair of positive and negative electrodes 18b and 18c of the light source 18. The first metal layer 19b is disposed so as to be separated from the light source 18 by the first insulating layer 19a, and includes a first electrically conducting layer 19ba electrically connecting to the positive electrode 18b of the light source 18 and a second electrically conducting layer 19bb electrically connecting to the negative electrode 18c of the light source 18. The second metal layer 19f is disposed so as to be separated from the light source 18 by the first insulating layer 19a and the second insulating layer 19e, and includes a first electrically conducting layer 19fa electrically connecting to the positive electrode 18b of the light source 18 and a second electrically conducting layer 19fb electrically connecting to the negative electrode 18c of the light source 18. The positive electrode 18b of the light source 18 is electrically connected to the first electrically conducting layers 19ba and 19fa through the corresponding electrically conducting interlayer contact portion 19t, and the negative electrode 18c of the light source 18 is electrically connected to the second electrically conducting layers 19bb and 19fb through the corresponding electrically conducting interlayer contact portion 19t.

The stricture of modification 5 allows the driving current supplied from the power source (not shown) to be conducted to the pair of positive and negative electrodes 18b and 18c of the light source 18 through the pair of first and second electrically conducting layers 19ba and 19bb and the pair of first and second electrically conducting layers 19fa and 19fb, thereby allowing the light source 18 to emit light.

The structure of Modification 5 has a heat radiation portion including the heat radiation route defined by the heat radiation terminals 18e of the light source 18, the heat-conducting interlayer contact portions 19h and the electrically isolated third metal layer 19k, and an electrically conducting portion including the electrically conducting route defined by the pair of positive and negative electrodes 18b and 18c of the light source 18, the pair of electrically conducting interlayer contact portions 19t, the pair of first and second electrically conducting layers 19ba and 19bb and another pair of first and second electrically conducting layers 19fa and 19fb. The heat radiation portion and the electrically conducting portion are insulated from each other by the first insulating layer 19a, the second insulating layer 19e, and the third insulating layer 19g.

Thus, the structure of Modification 5 has the heat radiation portion shown in FIG. 5B for releasing the heat generated from the light source 18 in association with the light emission of the light source 18, in addition to the electrically conducting portion for emitting light from the light source 18 as shown in FIG. 5C. Since the heat radiation portion and the electrically conducting portion are insulated from each other by the first insulating layer 19a, the second insulating layer 19e and the third insulating layer 19g, the heat radiation efficiency can be increased with insulation maintained.

Modification 6

While in the structure of the above-described embodiment, the heat radiation terminals 18e of the light source 18 are each connected to the second metal layer 19c of the flexible substrate 19 through the corresponding single heat-conducting interlayer contact portion 19h, each heat radiation terminal 18e of the light source 18 may be connected to the second metal layer 19c of the flexible substrate 19 through a plurality of heat-conducting interlayer contact portions 19h without particular limitation.

Modification 7

The flexible substrate 19 may be bent toward the optical waveguide 13 to increase the direct or indirect contact area between the electrically isolated second metal layer 19c of the flexible substrate 19 and the first frame 11, thus increasing the heat radiation efficiency.

For example, the first frame 11 has a bent portion 11b from the substrate-supporting surface 11a in the direction toward the optical waveguide 13 and a recess 11ba is formed in the bent portion 11b. The flexible substrate 19, which has the same fundamental structure as the structure of the embodiment, further has a bent portion 19y so as to oppose the bottom (bent portion) 11b of the first frame 11. The supported surface 19ya of the bent portion 19y of the flexible substrate 19 is in close contact with the surface of the bent portion 11b of the first frame 11 in the recess 11ba with the heat-conductive adhesive tape 20 in between. Consequently, the contact area between the second metal layer 19c of the flexible substrate 19 and the first frame 11 with the heat-conductive adhesive tape 20 in between can be increased more than the structure of the embodiment, and thus the heat radiation efficiency can further be increased.

While in Modification 7, the recess 11ba is formed in the bent portion 11b of the first frame 11 close to the substrate-supporting surface 11a, it is not necessary to form the recess 11ba in the bent portion 11b of the first frame 11.

Other Modifications

While the light source 18 of the embodiment has two heat radiation terminals 18e, the number of the heat radiation terminals 18e may be three or more without being limited to two.

The heat-conducting interlayer contact portion 19h may be filled with a metal or a resin. Preferably, the metal or resin has higher heat conductivity than the layers (insulating layers and other layers) through which the heat-conducting interlayer contact portion 19h passes. Thus, heat can be rapidly conducted to the electrically isolated second metal layer 19c (Embodiment) or third metal layer 19K (Modification 5).

While the flexible substrate 19 of the embodiment is mounted on the substrate-supporting surface 11a of the first frame 11 with close contact with the heat-conductive adhesive tape 20 in between, the flexible substrate 19 of the invention may be mounted on the substrate-supporting surface 11a with close contact by a known technique. For example, a fixing portion (not shown), may be a pinching structure) may be provided to closely fix the periphery of the flexible substrate 19 to the substrate-supporting surface 11a of the first frame 11, and the flexible substrate 19 may be mounted on the substrate-supporting surface 11a with close contact.

While the embodiment and modifications above each illustrate an illuminating device using a flexible substrate having flexibility as a substrate on which the light source is mounted, the substrate may not be flexible, but rigid, and such a rigid substrate can have the same structure.

Electronic Apparatus

The liquid crystal device 100 according to the above-described embodiment can be applied to electronic apparatuses. Such electronic apparatuses will now be described with reference to FIGS. 7A and 7B.

Figure 7A:
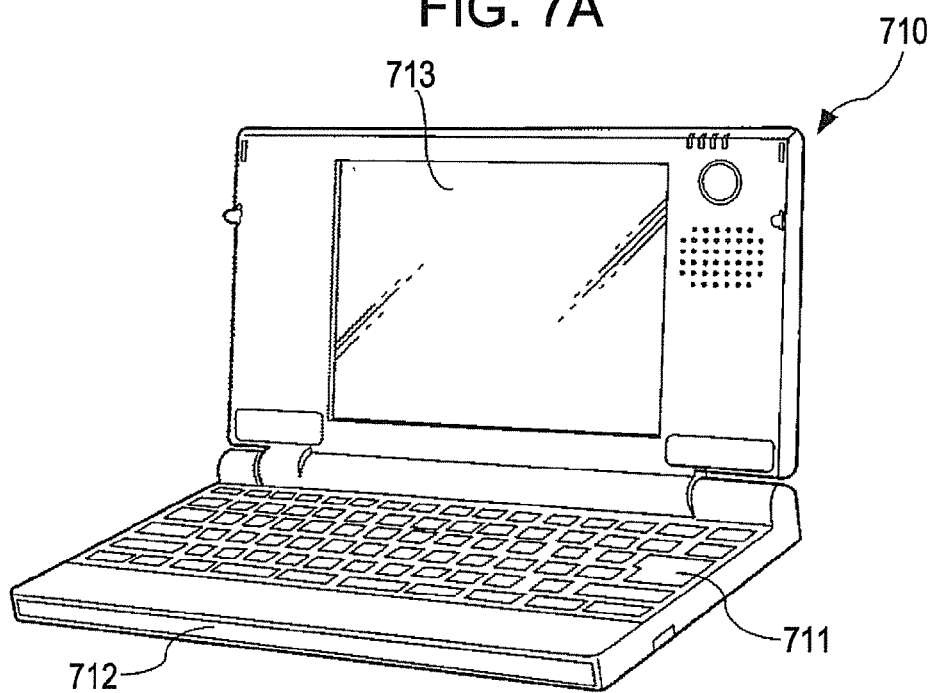
FIGS. 7A and 7B are perspective views of electronic apparatuses each including a liquid crystal device having an illuminating device according to an embodiment of the invention.

A portable personal computer (so called notebook PC) including the liquid crystal device 100 as the display portion will be first described. FIG. 7A is a perspective view of the personal computer. As shown in FIG. 7A, the personal computer 710 includes a body 712 having a keyboard 711 and a display portion 713 using the liquid crystal device 100 or the like.

Figure 7B:
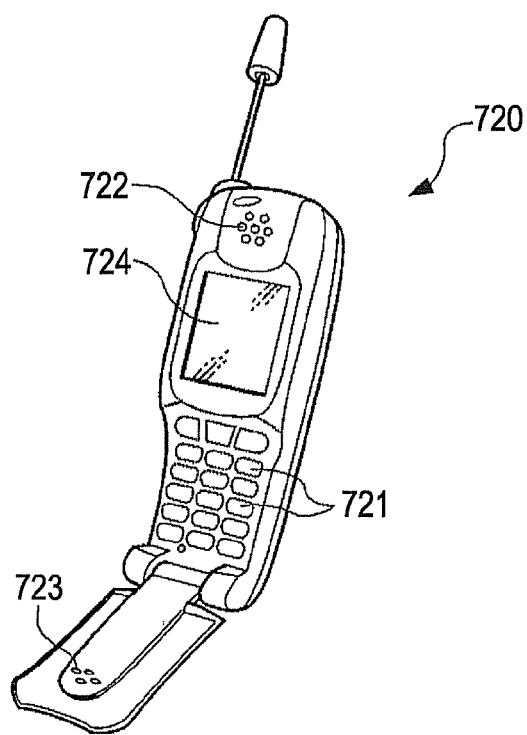

A cellular phone including the liquid crystal device 100 as the display portion will be described. FIG. 7B is a perspective view of the cellular phone. As shown in FIG. 7B, the cellular phone 720 includes a plurality of control buttons 721, an ear piece 722, a mouthpiece 723, and a display portion 724 using the liquid crystal device 100.

In addition to the personal computer as shown in FIG. 7A and the cellular phone as shown in FIG. 7B, electronic apparatus capable of using the liquid crystal device 100 include liquid crystal TV sets, viewfinder-type or monitor-direct-view-type video tape recorders, car navigation systems, pagers, electronic notebooks, electronic calculators, word processors, work stations, videophones, POS terminals, and digital still cameras.

What is claimed is:

1. An illuminating device comprising:
    a light source including a light-emitting element, an electrode electrically connected to the light-emitting element, and a heat radiation terminal electrically isolated from the light-emitting element; and
    a multilayer substrate including an insulating layer having a mount surface on which the light source is mounted with the electrode and the heat radiation terminal therebetween, an electrically conducting metal layer electrically connected to the electrode and disposed so as to be separated from the light source by the insulating layer having the mount surface and an electrically isolated metal layer electrically isolated from the electrically conducting metal layer and disposed further from the mount surface than the electrically conducting metal layer, an electrically conducting interlayer contact portion electrically connecting the electrode to the electrically conducting metal layer, and a heat-conducting interlayer contact portion connecting the heat radiation terminal to the electrically isolated metal layer.

2. The illuminating device according to claim 1, further comprising a first frame having a substrate-supporting surface on which the substrate is supported, the first frame being made of a material capable of releasing heat,
    wherein the substrate has a supported surface opposite the mount surface, the supported surface being in close contact with the substrate-supporting surface of the first frame.

3. The illuminating device according to claim 2, further comprising a heat-conductive adhesive material between the supported surface and the substrate- supporting surface.

4. The illuminating device according to claim 1, wherein the heat radiation terminal has a larger surface area than the electrode.

5. The illuminating device according to claim 2, further comprising a second frame made of an insulating material, engaged with the first frame,
    wherein the first frame is made of a metal and has a bent portion bent from one end of the substrate-supporting surface, the electrode is disposed at the second frame side, and the heat radiation terminal is disposed at the bent portion of the first frame.

6. The illuminating device according to claim 1, wherein the heat radiation terminal, the heat-conducting interlayer contact portion, and the electrically isolated metal layer define a heat radiation route constituting a heat radiation portion, and the electrode, the electrically conducting interlayer contact portion, and the electrically conducting metal layer define an electrically conducting route constituting an electrically conducting portion, and wherein the heat radiation portion and the electrically conducting portion are electrically insulated from each other by the insulating layer.

7. The illuminating device according to claim 1, wherein the substrate is flexible.

8. An electro-optic device comprising:
    a display panel; and
    the illuminating device as set forth in claim 1, the illumination device illuminating the display panel.

9. An electronic apparatus comprising the electro-optic device as set forth in claim 8, the electro-optic device acting as a display portion.

10. An illuminating device comprising:
    a light source including:
        a light-emitting element;
        an electrode electrically connected to the light-emitting element; and
        a heat radiation terminal electrically isolated from the light-emitting element; and
    a multilayer substrate including:
        an insulating layer having a mount surface, the light source is mounted on the mount surface, the electrode and the heat radiation terminal are between the insulating layer and the light source;
        an electrically conductive first metal layer electrically connected to the electrode and separated from the light source by the insulating layer;
        a second metal layer that is electrically isolated from the first metal layer, the second metal layer is positioned further from the mount surface than the first metal layer;
        an electrically conducting interlayer contact portion that electrically connects the electrode to the electrically conductive first metal layer; and
        a heat-conducting interlayer contact portion that connects the heat radiation terminal to the second metal layer.

11. An illuminating device comprising:
    a light source including:
        a light-emitting element;
        an electrode electrically connected to the light-emitting element; and
        a heat radiation terminal electrically isolated from the light-emitting element, the heat radiation terminal has a larger surface area than the electrode;
    a multilayer flexible substrate including:
        an insulating layer having a mount surface, the light source is mounted on the mount surface, the electrode and the heat radiation terminal are between the insulating layer and the light source;
        an electrically conductive first metal layer electrically connected to the electrode and separated from the light source by the insulating layer;
        a second metal layer that is electrically isolated from the first metal layer, the second metal layer is positioned further from the mount surface than the first metal layer;
        an electrically conducting interlayer contact portion that electrically connects the electrode to the electrically conductive first metal layer; and a heat-conducting interlayer contact portion that connects the heat radiation terminal to the second metal layer;
a first frame having a substrate-supporting surface that supports the multi-layer substrate, the first frame is made of a heat conductive metal; and
a second frame engaging the first frame, the second frame is made of an insulating material;
wherein the heat-conducting interlayer contact portion and the second metal layer define a heat radiation route constituting a heat radiation portion;
wherein the electrode, the electrically conducting interlayer contact portion, and the first metal layer define an electrically conducting route constituting an electrically conducting portion; and
wherein the heat radiation portion and the electrically conducting portion are electrically insulated from each other by the insulating layer and an insulative adhesive layer.

\* \* \* \* \*